| United States Patent [19] | [11] | 4,366,230 |
|---|---|---|
| Ahne et al. | [45] | Dec. 28, 1982 |

[54] METHOD FOR THE PREPARATION OF HIGHLY HEAT-RESISTANT RELIEF STRUCTURES AND THE USE THEREOF

[75] Inventors: Hellmut Ahne, Röttenbach; Eberhard Kühn, Hemhofen; Roland Rubner, Röttenbach, all of Fed. Rep. of Germany

[73] Assignee: Siemens Aktiengesellschaft, Munich, Fed. Rep. of Germany

[21] Appl. No.: 270,357

[22] Filed: Jun. 4, 1981

[30] Foreign Application Priority Data

Jun. 10, 1980 [DE] Fed. Rep. of Germany ....... 3021787

[51] Int. Cl.$^3$ .............................................. G03C 5/00
[52] U.S. Cl. ..................... 430/325; 430/17; 430/296; 430/302; 430/306; 430/311; 430/322; 430/270; 430/280; 204/159.15; 204/159.18; 528/73; 528/287; 528/289; 528/291; 528/337; 528/341
[58] Field of Search ............... 430/270, 280, 281, 296, 430/300, 302, 306, 311, 322, 325, 17; 204/159.15, 159.18; 528/73, 287, 289, 291, 337, 341

[56] References Cited

U.S. PATENT DOCUMENTS

| 3,957,512 | 5/1976 | Kleeberg et al. | 430/283 |
| 3,964,908 | 6/1976 | Bargon et al. | 430/270 |
| 4,121,936 | 10/1978 | Matsuda et al. | 430/270 |

*Primary Examiner*—Jack P. Brammer
*Attorney, Agent, or Firm*—Kenyon & Kenyon

[57] ABSTRACT

The invention relates to a method for the preparation of highly heat-resistant relief structures with a base of polymers of heterocyclic structure by applying radiation-sensitive soluble polymer precursor stages in the form of a film or foil to a substrate, irradiating the film or foil through negative patterns with actinic light or by deflecting a light, electron or ion beam, removing the non-irradiated film or foil portions and, optionally, by subsequent annealing, as well as to the use of relief structures prepared in this manner. It is provided to use as polymer precursor stages addition products of cyclic carboxylic-acid anhydrides with hydroxyl group-containing compounds, where the hydroxyl group-containing compounds represent addition products of olefinically unsaturated mono-epoxides on carboxyl group-containing prepolymers of polyimides, polyisoindoloquinazoline diones, polyoxazine diones and polyquinazoline diones or on amino group-containing prepolymers of polyimidazoles and polyimidazopyrrolones or on hydroxyl group-containing prepolymers of polyoxazoles. The relief structures prepared by the method according to the invention are suitable especially for use as resists, surface coating materials and insulating materials.

11 Claims, No Drawings

METHOD FOR THE PREPARATION OF HIGHLY HEAT-RESISTANT RELIEF STRUCTURES AND THE USE THEREOF

BACKGROUND OF THE INVENTION

The present invention relates to a method for the preparation of highly heat-resistant relief structures with a polymer base of heterocyclic structure by applying radiation-sensitive soluble polymer precursor stages in the form of a film or a foil to a substrate, irradiating the film or foil through negative patterns with actinic light or by deflecting a light, electron or ion beam, removing the non-irradiated film or foil portions and, optionally, subsequently annealing, as well as to the use of relief structures prepared in this manner.

A method for the preparation of relief structures of the type mentioned is known from German Pat. No. 2 308 830 and its corresponding U.S. Pat. No. 3,957,512. In this method, polyaddition and polycondensation products of polyfunctional carbocyclic or heterocyclic compounds carrying radiation-sensitive radicals with diamines, diisocyanates, bis-acid chlorides or dicarboxylic acids are used as soluble polymer precursor stages. The compounds which carry radiation-sensitive radicals contain two carboxyl, carboxylic-acid chloride, amino, isocyanate or hydroxyl groups suitable for addition or condensation reactions and in part, in ortho- or peri-position thereto, radiation-reactive groups which are bound to carboxyl groups in ester-fashion. The diamines, diisocyanates, bis-acid chlorides and dicarboxylic acids to be reacted with these compounds exhibit at least one cyclic structure element.

The soluble polymer precursor stages are cross-linked when irradiated and change in the process into insoluble intermediate products. In annealing, these intermediate products are subjected to cyclization, highly heat-resistant polymers of the following classes of substances being formed: Polyimides (including polyamidimides and polyesterimides), poly-1,3-quinazoline-2,6-diones, polyisoindoloquinazoline diones, poly-1,3-oxazine-6-ones and polybenz-1,3-oxazine-2,4-diones.

The relief structures prepared by the known method have found good acceptance in practice. However, it also has been found that difficulties still occur which stem from the polymer precursor stages. These precursor stages are soluble only in organic solvents, so that on the one hand, they can be processed only in such solvents, and on the other hand, the structures prepared from the polymer precursor stages by irradiation can be developed only with the aid of organic solvents. If organic developers are used for removing non-irradiated portions, however, problems with respect to toxicity and flammability, as well as problems in disposal, arise.

SUMMARY OF THE INVENTION

It is an object of the present invention to further improve the method of the type mentioned at the outset for the preparation of relief structures from polymer precursor stages, where, in particular, the problems connected with the use of organic developers are eliminated.

According to the present invention, this and other objects are achieved through the use of addition products of cyclic carboxylic-acid anhydrides with hyroxyl group-containing compounds as polymer precursor stages, where the hydroxyl group-containing compounds are addition products of olefinically unsaturated mono-epoxides on:

carboxyl group-containing polyaddition products of aromatic and/or heterocyclic tetracarboxylic-acid dianhydrides and diamino compounds or diamino compounds with at least one ortho-position amido group or on carboxyl group-containing polyaddition products of aromatic and/or heterocyclic dihydroxydicarboxylic acids or corresponding diaminodicarboxylic acids and diisocyanates; or amino group-containing polycondensation products of aromatic and/or heterocyclic tetraamino compounds with dicarboxylic-acid chlorides or esters, or on amino group-containing polyaddition products of the tetraamino compounds and tetracarboxylic-acid dianhydrides; or hydroxyl group-containing polycondensation products of aromatic and/or heterocyclic dihydroxydiamino compounds with dicarboxylic-acid chlorides or esters.

By the method according to the present invention, relief structures can be made in a simplified manner because the polymer precursor stages used therein are highly soluble in aqueous alkaline solvents. It is thus made possible that in the preparation of polymers on the basis of negative resists, the development can be performed as with positive resists, i.e., employing aqueous alkaline developers. This results not only in economic advantages because positive-resist developers and facilities can be used, but the dangers connected with the use of organic developers, such as toxicity and flammability, as well as problems regarding disposal, are eliminated, so that health-related and ecological advantages also are obtained.

In the method according to the present invention, the polymer precursor stages can advantageously be employed together with light- or radiation-sensitive co-polymerizable compounds. For this purpose, N-substituted maleinimides preferably are used. However, acrylate or methacrylate group-containing compounds also can be employed. Furthermore, customary photo initiators and/or sensitizers also can be used (see: "Industrie Chimique Belge", Vol. 24, 1959, Pages 739 to 764, as well as J. Kosar, "Light-Sensitive Systems", John Wiley & Sons, New York 1965, Pages 143 to 146 and Pages 160 to 180). Especially well suited are Michler's ketone and/or benzoin ether; 2-tert.butyl-9,10-anthraquinone, 1,2-benz-9,10-anthraquinone; and 4,4'-bis(diethylamino)-benzophenone. Adhesion agents can further be used to advantage with the method according to the present invention. This purpose is served, in particular, by silanes such as vinyl-triethoxy silane, vinyl-tris($\beta$-methoxy-ethoxy) silane, $\gamma$-methacryloxy-propyl-trimethoxy silane and $\gamma$-glycidoxy-propyl-trimethoxy silane.

The radiation-reactive precursor stages used in the method according to the present invention, which are of an oligomeric and/or polymeric nature, are described in the concurrently filed U.S. patent application "Radiation-Reactive Precursor Stages of Highly Heat-Resistant Polymers", Ser. No. 270,637. These precursors stages exhibit in general the following structure:

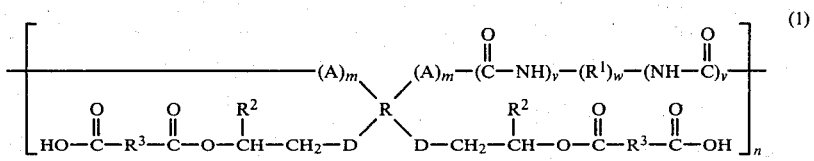

(1)

or

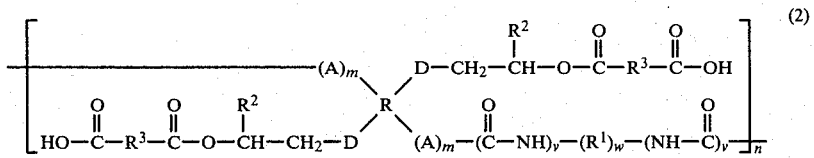

(2)

In Formulas (1) and (2), n is an integral number from 2 to about 100; m, v and w are 0 or 1. The following applies to R, $R^1$, $R^2$, $R^3$, A and D:

R is an optionally halogenated, at least partially aromatic and/or heterocyclic tetravalent, i.e., tetrafunctional, radical, in which two valences respectively are arranged in adjacent positions; if the radical R has several aromatic and/or heterocyclic structure elements, then the pairs of valences are situated at respective end-position structure elements of this type;

$R^1$ is an optionally halogenated divalent, i.e., difunctional, radical of aliphatic and/or cycloaliphatic structure, optionally having heteroatoms, and/or aromatic and/or heterocyclic structure;

$R^2$ is an olefinically unsaturated radical, for example, an allyl ether-containing or a maleinimide-containing group and in particular, an optionally substituted (meth)acrylester-containing group;

$R^3$ is an optionally halogenated divalent, i.e., difunctional, radical of aliphatic and/or cycloaliphatic, olefinically unsaturated and/or aromatic and/or heterocyclic structure;

A is —O—, —NH— or

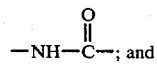; and

D is

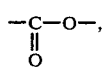,

—O—, —S—, —NH— or

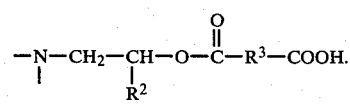

The following also applies to these structures: For m=1 and v=1, A=—NH— or —O— and D=

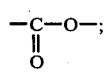

for m=0 and v=1, D=

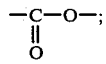

for m=1 and v=0, A=

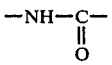

and D=—O—, —S— —NH— or

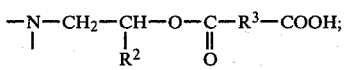

for m=0 and w=0, v=1.

Preferred are the following polymer precursor stages which are shown in Formulae (3) to (9):

(3) addition product of a carboxylic-acid anhydride and a polyimide precursor stage, obtained by addition of glycidylmethacrylate on the polyaddition product of pyromellithic-acid dianhydride and 4,4'-diaminodiphenyl ether;

(4) addition product of a carboxylic-acid anhydride and a polyisoindoloquinazoline dione precursor stage, obtained by addition of glycidylmethacrylate on the polyaddition product of pyromellithic-acid dianhydride and 4,4'-diaminodiphenyl-3,3'-dicarboxylic-acid amide;

(5) addition product of a carboxylic-acid anhydride and a polyoxazine-dione precursor stage, and specifically a polybenzoxazine-dione precursor stage, obtained by addition of glycidylacrylate on the polyaddition product of 4,4'-dihydroxydiphenylmethane-3,3'-dicarboxylic acid and 4,4'-diphenylmethanediisocyanate;

(6) addition product of a carboxylic-acid anhydride and a polyquinazoline-dione precursor stage, obtained by addition of glycidylmethacrylate on the polyaddition product of 4,4'-diaminodiphenylmethane-3,3'-dicarboxylic acid and 4,4'-diphenylmethanediisocyanate;

(7) addition product of a carboxylic-acid anhydride and a polyimidazole precursor stage, and specifically a polybenzimidazole precursor stage, obtained by addition of glycidylmethacrylate on the polycondensation product of 3,3'-diaminobenzidine and isophthalic-acid dimethyl ester;

(8) addition product of a carboxylic-acid anhydride and a polyimidazopyrrolone precursor stage, obtained by addition of glycidylmethacrylate on the polyaddition product of 3,3'-diaminobenzidine and pyromellithic-acid dianhydride;
(9) addition product of a carboxylic-acid anhydride and a polyoxazole precursor stage, and specifically a polybenzoxazole precursor stage, obtained by addition of glycidylmethacrylate on the polycondensation product of 3,3'-dihydroxybenzidine and isophthalic-acid dichloride.
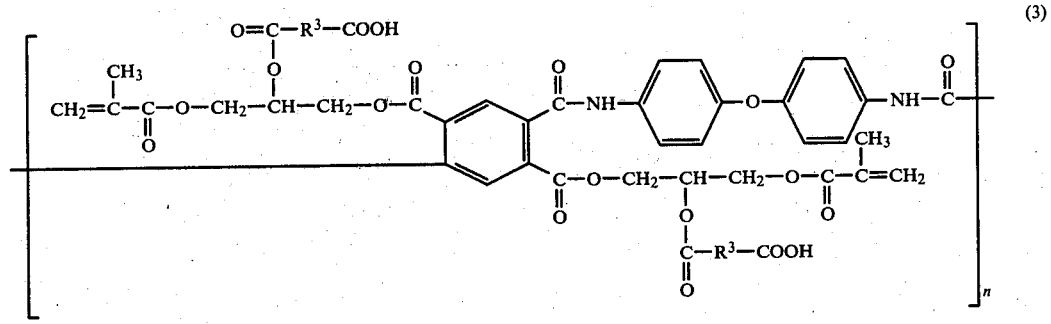
(3)
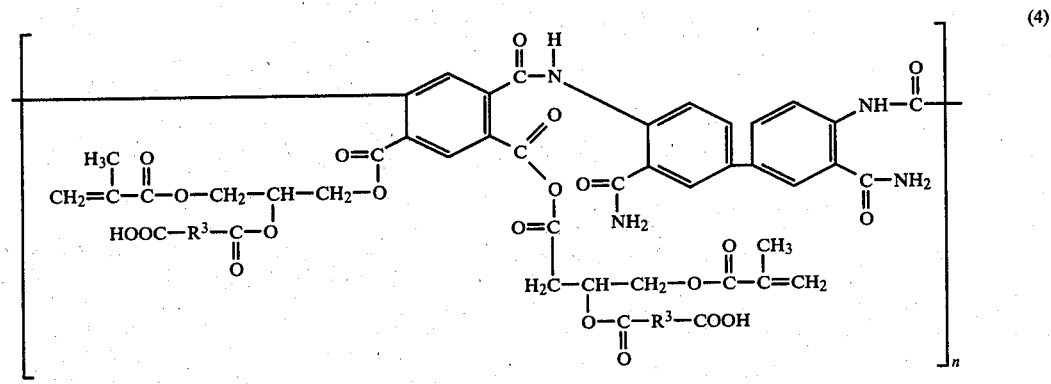
(4)
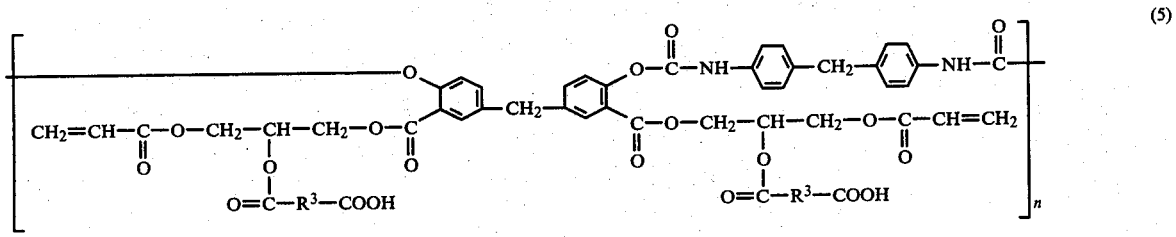
(5)
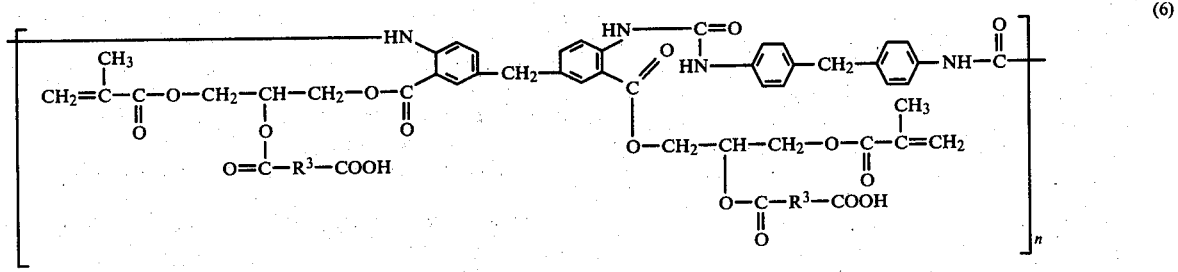
(6)
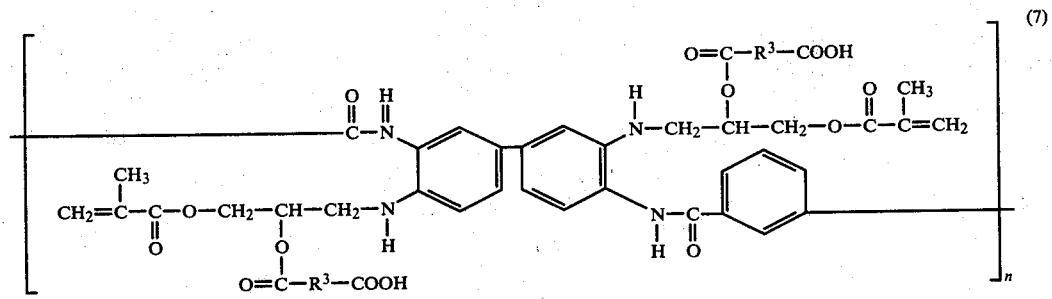
(7)

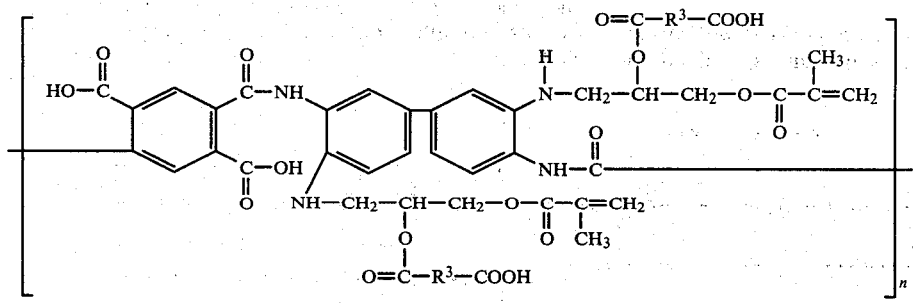

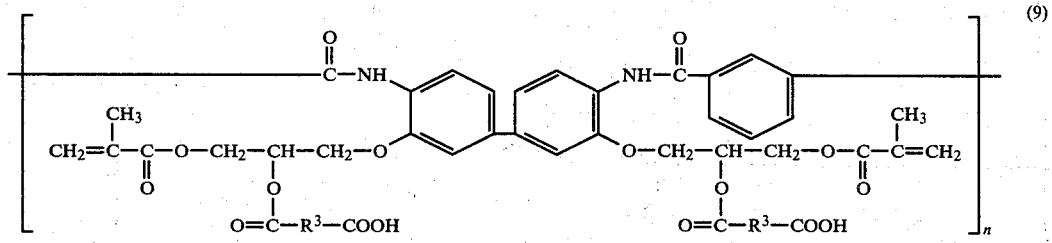

The relief structures according to the present invention are prepared, as already mentioned, in such a manner that the polymer precursor stage is applied in the form of a film or a foil to a substrate and is exposed with actinic light through a mask or is irradiated by directing a light, electron or ion beam; subsequently the non-exposed or non-irradiated film or foil portions are dissolved-out or pulled off, and the then obtained relief structures are optionally annealed.

The precursor stage can be applied to the substrate dissolved in an organic solvent, particularly N-methyl-pyrrolidone; however, aqueous alkaline solutions also can serve as solvents. The concentration of the developer solution can be adjusted so that layer thicknesses of 0.01 μm to several 100 μm can be produced with known coating methods such as centrifuging, immersion, spraying, brushing or rolling. It has been found, for example, that with centrifuge coating, 300 to 10,000 r.p.m. for 1 to 100 seconds are suited to achieve a uniform and high surface quality.

The photoresist layer applied to the substrate, which consists preferably of silicon dioxide or silicon nitride, glass, metal, plastic or semiconducting material, can be freed of solvent at room temperature or at elevated temperature, preferably at a temperature of 50° to 80° C. in a nitrogen or air stream; operation in a vacuum also is possible.

To obtain a sufficient solubility difference between irradiated and non-irradiated layer or foil portions, exposure times between 10 and 800 seconds are sufficient with the method according to the present invention, depending on the composition and the film thickness, if a 500-W very-high-pressure mercury lamp is used. After the exposure, the non-irradiated parts of the film or the foil are dissolved-out by means of an aqueous alkaline developer.

By means of the method according to the present invention, images with sharp contours are obtained, i.e., relief structures which are converted by annealing into highly heat-resistant polymers which are resistant to acids and alkaline solutions. In general, temperatures from about 150° to 500° C. can be chosen; preferably, the annealing is performed at temperatures from about 300° to 400° C. The annealing time is generally 10 minutes to 1 hour, and preferably half an hour, and in inert gas, appreciable discoloration is generally not observed. The edge sharpness and dimensional accuracy of the relief structures are substantially undegraded by the annealing. In addition, the high surface quality of the relief structures is preserved despite the loss of layer thickness which occurs in the anneal.

The relief structures according to the present invention find application in the preparation of passivating films on semiconductor components, of thin and thick film circuits, of solder protection layers on multilayer circuits, of insulating layers of multilayer circuits and of miniaturized insulating layers on electrically conducting and/or semiconducting and/or insulating base materials, especially in the field of microelectronics or generally for the fine structuring of substrates. The highly heat-resistant relief structures serve preferably as masks for wet and dry etching processes, currentless or electroplated metal deposition and vapor deposition methods, as well as masks for ion implantation. Additionally, the structures may serve as insulating and protective layers in electrotechnology. The relief structures can further be used to advantage as orientation layers, for example, in liquid-crystal displays, as well as for rastering surfaces, for example, in X-ray screens, especially in X-ray image amplifiers. In addition, the structures are suitable as a dielectric for capacitive humidity sensors and as light-conducting layers in optoelectronics as well as for the preparation of printing plates.

DETAILED DESCRIPTION OF THE INVENTION

The invention is explained in greater detail with the aid of the following embodiment examples.

EXAMPLE 1

Preparation Of A Radiation-Reactive Precursor Stage for Polybenzoxazole

To a solution of 6.49 parts by weight 3,3'-dihydroxybenzidine in 50 parts by volume dimethylacetamide and 9 parts by volume pyridine, 6.1 parts by weight isophthalic-acid dichloride in 20 parts by volume cyclohexanone at a temperature of −5° to −20° C. are added dropwise, while stirring intensively, within about 30 minutes. After continued stirring at room temperature for 3 hours, the viscous reaction solution is allowed to stand overnight; the solution then is added dropwise to 1000 parts by volume water, while stirring. The resin precipitated thereby is separated, washed with water and methanol and dried in a vacuum at about 60° C.

10 parts by weight of the polybenzoxazole prepolymer prepared in the manner described are dissolved in 100 parts by volume N-methylpyrrolidone. To this solution are added 50 parts by volume glycidylmethacrylate, 0.5 parts by volume benzyldimethylamine and 0.5 parts by weight hydroquinone. After heating for 2 hours to a temperature of about 90° C., the reaction product is precipitated, while stirring, from 1000 parts by volume ethanol and is dried in a vacuum.

3.2 parts by weight of the addition product obtained are dissolved in 35 parts by volume N-methylpyrrolidone. While stirring, 1 part by weight itaconic-acid anhydride is added to this solution. After a reaction time of 20 hours at room temperature, heat is applied for 3 hours at 50° to 60° C. The reaction solution then is added drop-wise to 500 parts by volume water, while stirring vigorously. The precipitate collected is drawn off and dried at room temperature in a vacuum.

Preparation Of The Relief Structure 2 parts by weight of the resin prepared in the manner described above are dissolved together with 0.1 parts by weight N-phenylmaleinimide and 0.04 parts by weight Michler's ketone in 10 parts by volume of a dimethylacetamide/dioxane mixture (volume ratio 1:1) and centrifuged on an aluminum foil at 2000 r.p.m. After drying for 2 hours at 60° C. in a vacuum, exposure is made with a 500-W very-high-pressure mercury lamp through a contact mask and a developer then is applied for 2 minutes in the form of 0.7-% sodium hydroxide solution. Layers with a layer thickness of 4.6 μm are obtained; structures of 10 μm can still be resolved. After annealing at 400° C. for 45 minutes, the layer thickness is 2.6 μm. The edge sharpness and the resolution of the relief structures are not adversely affected by the anneal.

EXAMPLE 2

Preparation Of A Radiation-Reactive Precursor Stage For Polybenzimidazole 10.7 parts by weight 3,3′-diaminobenzidine are dissolved in 95 parts by volume N-methylpyrrolidone and heated, together with 9.7 parts by weight isophthalic-acid dimethyl ester, for 8 hours to a temperature of 150° to 175° C. and subsequently for 2 days to approximately 185° C. To this solution are then added 40 parts by volume glycidylmethacrylate. After a reaction time of 48 hours at room temperature and 4 hours at about 50° to 60° C., 8 parts by weight itaconic-acid anhydride are added to the reaction mixture and are reacted within 4 days at room temperature.

Preparation Of The Relief Structure

To the reaction solution prepared in the manner described above, 0.9 parts by weight N-phenylmaleinimide and 0.55 parts by weight Michler's ketone are added and this mixture is centrifuged on an aluminum foil at 1000 r.p.m. After a drying process at 50° to 60° C. in a vacuum for 2 hours, the layer thickness is 4.6 μm. Subsequently, a 5-minute exposure is made through a contact mask with a 500-W very-high-pressure mercury lamp and the film is then immersion-developed for 15 seconds in a commercially available alkaline developer which was diluted with water in a volume ratio of 1:3. 50 μm structures of the mask are then imaged with sharp edges. A 30 minute annealing operation at 300° C. leads to a layer thickness of 2.4 μm; the high image quality is not impaired.

EXAMPLE 3

Preparation Of A Radiation-Reactive Precursor Stage For Polyimide

To 65.4 parts by weight pyromellithic-acid dianhydride (0.3 mol) in 450 parts by volume dimethylacetamide, 45 parts by weight 4,4′-diaminodiphenyl ether (0.23 mol) are added, while stirring, and subsequently, the solution is stirred for 2 hours at room temperature. Then, 2 parts by weight methacrylic acid-2-hydroxyethyl ester (0.016 mol) are added to the reaction mixture in order to bind the still present end-position anhydride groups. After stirring at room temperature for 2 hours, 150 parts by volume glycidylmethacrylate, 1.5 parts by volume benzyldimethylamine and 0.1 parts by weight hydroquinone are added to the reaction solution. Subsequently, the solution is warmed to a temperature of 50° to 60° C. while stirring for 23 hours and then it is added drop-wise to 4000 parts by volume ethanol while stirring vigorously. The precipitate formed is drawn off and is dried in a vacuum at room temperature. 35 parts by weight of the polyimide precursor stage obtained are dissolved in 100 parts by volume dimethylacetamide, and 10 parts by weight maleic acid anhydride are added thereto. After a reaction time of 5 days at room temperature, the resin solution is diluted with 50 parts by volume dimethylacetamide and precipitated from 2500 parts by volume water. The resin is washed with water and is dried in a vacuum.

Preparation Of The Relief Structure 4.5 parts by weight of the resin prepared in the manner described above are dissolved, together with 0.2 parts by weight N-phenylmaleinimide and 0.09 parts by weight Michler's ketone, in 10 parts by volume dimethylacetamide. Subsequently, the solution is centrifuged on an aluminum foil at 6000 r.p.m. and dried at 60° C. in a vacuum for 1 hour. The thickness of the layer thus obtained is 1.6 μm. This layer is irradiated for 10 minutes with UV light (500-W very-high-pressure mercury lamp) through a mask pattern and sprayed for 15 seconds with a commercial alkaline developer diluted with water, and then for another 10 seconds with water. Sharp-edged structures with a resolution of 50 μm are produced. After the layer was heated for 30 minutes to 300° C. and 20 minutes to 400° C., the layer thickness was 0.85 μm and the edge sharpness remained unchanged.

EXAMPLE 4

Preparation Of A Radiation-Reactive Precursor Stage For Polyisoindoloquinazoline Dione 11 parts by weight 4,4′-diaminodiphenyl-3,3′-dicarboxylic-acid amide are made into a suspension with 120 parts by volume dimethylacetamide and are reacted, while stirring, with 10 parts by weight pyromellithic acid dianhydride, dissolved in 100 parts by volume of a dimethylacetamide/dimethylformamide mixture (volume ratio 1:1). After stirring for 2 hours, 25 parts by volume glycidylmethacrylate, 0.5 parts by volume benzyldimethylamine and 0.05 parts by weight hydroquinone monomethyl ether are added to the solution obtained. After stirring for 25 hours at a temperature of 60° C., a resin is precipitated from the solution with 3000 parts by volume propanol, and is dried.

10 parts by weight of the resin are dissolved in 100 parts by volume dimethylacetamide and reacted with 5 parts by weight maleic acid anhydride. After allowing the solution to stand for 5 days at about 30° C., the reaction solution is added dropwise to 1000 parts by volume water and the precipitated resin is dried.

Preparation Of The Relief Structure 3 parts by weight of the resin prepared in the manner described above are dissolved together with 0.1 parts by weight N-phenylmaleinimide and 0.06 parts by weight Michler's ketone in 20 parts by volume dimethylformamide and centrifuged on an aluminum foil to form films 1 $\mu$m thick. Drying at 60° C. follows and an exposure 7 minutes long is made through a contact mask with a 500-W very-high-pressure mercury lamp. After development with an aqueous alkaline developer solution (duration 15 seconds), relief structures are obtained, the geometry of which is not changed, even after a half-hour anneal at 400° C.; after the heat treatment, the layer thickness is 0.7 $\mu$m.

The relief structures according to the invention are preferably suitable for application as a resist with intermediate protective function for lithographic structuring of surfaces, particularly for the dry etching process, or for permanent coating or screening of surfaces, or as a protective or insulating material for electrical engineering purposes.

What is claimed is:

1. In a method for the preparation of a highly heat-resistant relief structure having a polymer base of heterocyclic structure wherein a radiation-sensitive soluble polymer precursor is applied in the form of a film or a foil to a substrate, the film or foil is irradiated through negative patterns with actinic light or by deflecting a light, electron or ion beam, and the non-irradiated film or foil portions are removed, the improvement comprising using as said polymer precursor a polymeric compound consisting of the addition product of (a) a cyclic carboxylic acid anhydride and (b) a hydroxyl group-containing compound, said hydroxyl group-containing compound itself being an addition product of (a) an olefinically unsaturated monoepoxide and (b) a member selected from the group consisting of:

(1) a carboxyl group-containing polyaddition product of (i) an aromatic and/or heterocyclic tetracarboxylic acid dianhydride and (ii) a diamino compound or a diamino compound with at least one ortho-position amido group;
(2) a carboxyl group-containing polyaddition product of (i) a member selected from an aromatic and/or heterocyclic dihydroxydicarboxylic acid or an aromatic and/or heterocyclic diaminodicarboxylic acid and (ii) a diisocyanate;
(3) an amino group-containing polycondensation product of (i) an aromatic and/or heterocyclic tetraamino compound and (ii) a dicarboxylic acid chloride or ester;
(4) an amino group-containing polyaddition product of (i) an aromatic and/or heterocyclic tetraamino compound and (ii) a tetracarboxylic acid dianhydride; and
(5) a hydroxyl group-containing polycondensation product of (i) an aromatic and/or heterocyclic dihydroxydiamino compound and (ii) a dicarboxylic acid chloride or ester.

2. The method according to claim 1 wherein the polymer precursor is employed together with light- or radiation-sensitive copolymerizable compounds.

3. The method according to claim 2 wherein said copolymerizable compounds are N-substituted maleinimides.

4. The method according to claim 1 wherein adhesion agents are employed with said polymer precursor.

5. The method according to claim 4 wherein said adhesion agents are silanes.

6. The method according to claim 1 wherein said polymer precursor is an addition product of maleic acid anhydride and a hydroxyl group-containing polyimide precursor.

7. The method according to claim 1 wherein said polymer precursor is an addition product of maleic acid anhydride and a hydroxyl group-containing polyisoindoloquinazoline dione precursor.

8. The method according to claim 1 wherein said polymer precursor is an addition product of itaconic-acid anhydride and a hydroxyl group-containing polyimidazole precursor.

9. The method according to claim 1 wherein said polymer precursor is an addition product of itaconic-acid anhydride and a hydroxyl group-containing polyoxazole precursor.

10. The method according to claim 1 wherein the relief structure is annealed after removal of the non-exposed or non-irradiated film or foil portions.

11. A highly heat-resistant relief structure prepared according to the method of claim 1.

* * * * *